US 8,558,350 B2

(12) United States Patent
Huang et al.

(10) Patent No.: US 8,558,350 B2
(45) Date of Patent: Oct. 15, 2013

(54) METAL-OXIDE-METAL CAPACITOR STRUCTURE

(75) Inventors: Jiun-Jie Huang, Kaohsiung (TW); Ling-Sung Wang, Tainan (TW); Chi-Yen Lin, Tainan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/274,122

(22) Filed: Oct. 14, 2011

(65) Prior Publication Data

US 2013/0093047 A1  Apr. 18, 2013

(51) Int. Cl.
H01L 21/02 (2006.01)

(52) U.S. Cl.
USPC .... 257/602; 257/752; 257/774; 257/E21.168; 257/E21.476; 257/E21.576; 257/E23.145; 257/E29.344

(58) Field of Classification Search
USPC .......... 257/602, 620, 752–774, E21.164, 168, 257/364, 476, 576–599, 23.002, 145, 257/29.344
See application file for complete search history.

(56) References Cited

U.S. PATENT DOCUMENTS

| | | | | |
|---|---|---|---|---|
| 5,970,003 A * | 10/1999 | Miyatake et al. | | 365/200 |
| 6,281,541 B1 * | 8/2001 | Hu | | 257/306 |
| 6,949,806 B2 * | 9/2005 | Wu et al. | | 257/412 |
| 6,998,712 B2 * | 2/2006 | Okada et al. | | 257/758 |
| 7,294,932 B2 * | 11/2007 | Hiroi | | 257/758 |
| 7,994,609 B2 * | 8/2011 | Quinn | | 257/532 |
| 8,035,197 B2 * | 10/2011 | Tsutsue | | 257/620 |
| 8,274,080 B2 * | 9/2012 | Han | | 257/48 |
| 2009/0068814 A1 * | 3/2009 | Cho et al. | | 438/386 |
| 2009/0121322 A1 * | 5/2009 | Ozawa | | 257/620 |
| 2009/0267193 A1 * | 10/2009 | Hayasaki | | 257/620 |
| 2010/0127347 A1 * | 5/2010 | Quinn | | 257/532 |
| 2010/0264414 A1 * | 10/2010 | Homma et al. | | 257/48 |
| 2011/0298551 A1 * | 12/2011 | Yen et al. | | 331/117 FE |
| 2012/0092806 A1 * | 4/2012 | Hua et al. | | 361/306.3 |

* cited by examiner

Primary Examiner — Michael Lebentritt
(74) Attorney, Agent, or Firm — Slater & Matsil, L.L.P.

(57) ABSTRACT

A metal-oxide-metal capacitor comprises a first electrode, a second electrode, a plurality of first fingers and a plurality of second fingers. Each first finger and its corresponding second finger are in parallel and separated by a low k dielectric material. A guard ring is employed to enclose the metal-oxide-metal capacitor so as to prevent moisture from penetrating into the low k dielectric material.

20 Claims, 3 Drawing Sheets

METAL-OXIDE-METAL CAPACITOR STRUCTURE

BACKGROUND

Modern electronic devices such as a notebook computer comprise a variety of memories to store information. Each memory cell may require at least a capacitor to retain information. According to common practice, metal-oxide-metal (MOM) capacitors can provide adequate capacitance for integrated circuits such as memory circuits. A single layer MOM capacitor may comprise a first metal plate, a second metal plate and an insulation layer deposited between the first metal plate and the second metal plate. The capacitance of the single layer MOM capacitor is proportional to the area of the metal plates and the dielectric constant of the insulation layer.

In order to provide a larger capacitance while keeping a smaller die area of a MOM capacitor, the MOM capacitor may include a plurality of layers stacked together. A multilayer MOM capacitor may comprise two electrodes. Each electrode is coupled to a plurality of fingers, each of which and its corresponding finger coupled to the other electrode form a sub-capacitor. On one layer of the MOM capacitor, various sub-capacitors are formed by a variety of neighboring fingers. The total capacitance of each layer is equal to the sum of the sub-capacitors on this layer. Furthermore, the electrodes of the multilayer MOM capacitor connect all layers together through a plurality of via plugs. As a result, the total capacitance of the multilayer MOM capacitor is equal to the sum of the capacitances of all layers of the multiplayer MOM capacitor.

The semiconductor industry has experienced rapid growth due to improvements in the integration density of a variety of electronic components (e.g., transistors, diodes, resistors, capacitors, etc.). This improvement in integration density has come from shrinking the semiconductor process node (e.g., shrink the process node towards small feature sizes, such as 65 nanometers, 45 nanometers, 32 nanometers and below). Semiconductor technologies with small feature sizes lead to more interactions between semiconductor fabrication and design. For example, the impact of moisture stored in a MOM capacitor will become more important for devices with small feature sizes. The moisture stored in a MOM capacitor must be lowered down to a minimum level so as to ensure the devices with small feature sizes meet the performance index to which they are specified.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, a guard ring for a multilayer metal-oxide-metal (MOM) capacitor structure. The invention may also be applied, however, to a variety of semiconductor devices.

Figure 1:
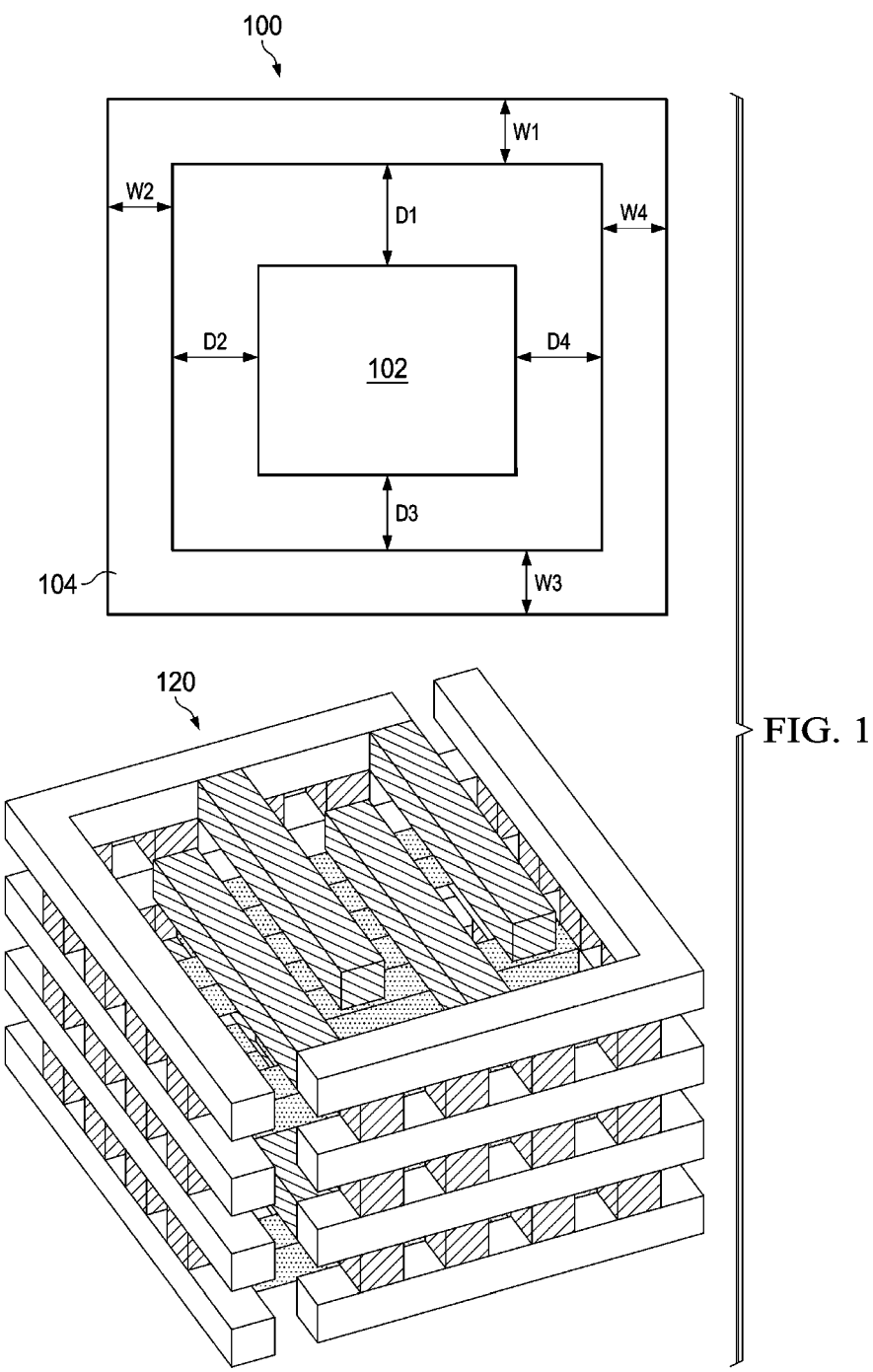
FIG. 1 illustrates a top view of a MOM capacitor structure in accordance with an embodiment.

Referring initially to FIG. 1, a top view of a MOM capacitor structure is illustrated in accordance with an embodiment. The MOM capacitor structure 100 may comprise a MOM capacitor 102 and a guard ring 104. The MOM capacitor 102 is formed of a plurality of MOM layers stacked together. In accordance with an embodiment, there may be four MOM layers. Each MOM layer may comprise two electrodes and two groups of fingers to form a single layer MOM capacitor. The detailed description of the single layer MOM capacitor will be discussed below with reference to FIG. 2 and FIG. 3. Furthermore, as shown in a perspective view 120 of the MOM capacitor 102, a variety of via plugs connect the neighboring MOM layers together. As a result, two corresponding electrodes located in two neighboring layers are connected together. In accordance with the characteristics of capacitors, the electrical equivalent circuit of the MOM capacitor 102 is equal to a plurality of single layer MOM capacitors connected in parallel.

The guard ring 104 may be formed of a plurality of conductive members and via plugs located in the different layers of the MOM capacitor structure 100. The detailed configuration of the guard ring 104 will be illustrated below with respect to FIG. 4. As shown in FIG. 1, the distances between each side of the MOM capacitor 102 and the corresponding inner edge of the guard ring 104 are defined as D1, D2, D3 and D4 respectively. In accordance with an embodiment, the minimum distance between the MOM capacitor 102 and the guard ring 104 (e.g., D1) is approximately 70 nm. Furthermore, the top view shows that the guard ring 104 has the shape of a quadrangular frame comprising four straight sides. The widths of the four sides are defined as W1, W2, W3 and W4 respectively. In accordance with an embodiment, the minimum width of the guard ring 104 (e.g., W1) is approximately 70 nm. In sum, one skilled in the art will realize that either the minimum distance (e.g., D1) or the minimum width (e.g., W1) is related to the technologies used and will be reduced when the semiconductor fabrication technique moves down to the next process node.

It should be noted that while FIG. 1 shows the guard ring 104 has the shape of a quadrangular frame, this diagram is merely an example, which should not unduly limit the scope of various embodiments. It is within the scope and spirit of various embodiments for the guard ring 104 to comprise other shapes, such as, but no limited to oval, square, or circular. It should further be recognized that while FIG. 1 illustrates the guard ring 104 with one single MOM capacitor 102, the guard ring 104 could accommodate any number of MOM capacitors. It should be noted that the guard ring 104 is used to protect the MOM capacitor 102. The MOM capacitors shown in FIGS. 1-3 are selected purely for demonstration purposes and are not intended to limit the various embodiments of the present invention to any particular type of MOM capacitors.

One advantageous feature of having a guard ring 104 enclosing the MOM capacitor 102 is that the guard ring 104 can prevent moisture from penetrating into the insulation layer of the MOM capacitor 102 so as to improve the reliability of the MOM capacitor 102.

In accordance with an embodiment, the MOM capacitor 102 may comprise a plurality of MOM layers. The layouts in the different MOM layers may have an alternating pattern. In other words, the top views of the MOM layers with odd numbers are similar to the top view of the first MOM layer. Likewise, the top views of the MOM layers with even numbers are similar to the top view of the second MOM layer. For simplicity, only the first MOM layer and the second MOM layer are shown in FIG. 2 and FIG. 3. The other layers of the MOM capacitor 102 are similar to the first and second MOM layers, and hence are not illustrated in detail to avoid unnecessary repetition.

Figure 2:
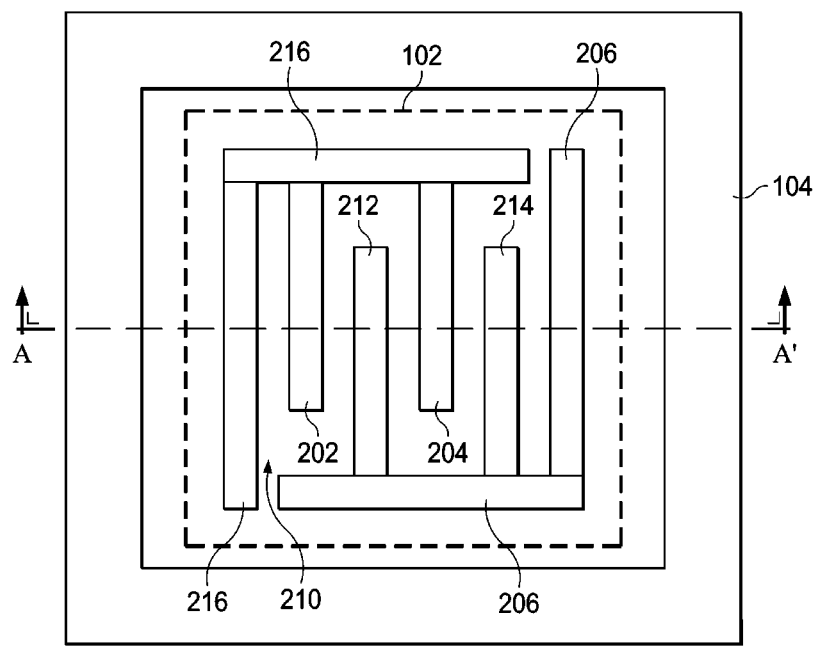
FIG. 2 illustrates a top view of a first MOM layer of a MOM capacitor in accordance with an embodiment.
Figure 3:
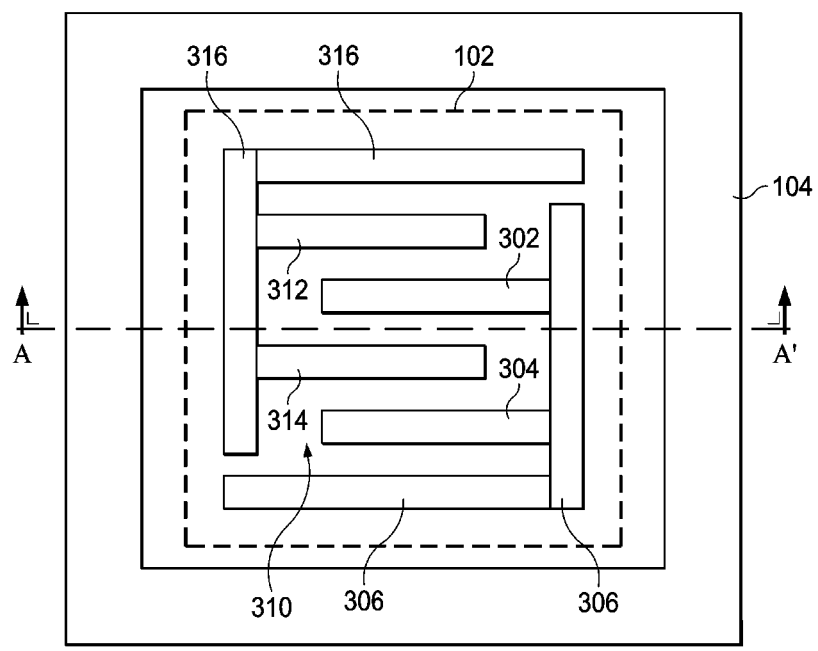
FIG. 3 illustrates a top view of a second MOM layer of a MOM capacitor in accordance with an embodiment.

FIG. 2 illustrates a top view of a first MOM layer of a MOM capacitor in accordance with an embodiment. The first MOM layer comprises two electrodes, namely a first electrode 206 and a second electrode 216. Each electrode may comprise a plurality of fingers. For simplicity, four fingers 202, 204, 212 and 214 are selected to illustrate the configuration of the first MOM layer. As shown in FIG. 2, the fingers 202 and 204 are coupled to the first electrode 206. Likewise, the fingers 212 and 214 are coupled to the second electrode 216. As shown in FIG. 2, two neighboring fingers (e.g., 202 and 212) are in parallel and separated by an insulation material 210. As such, two neighboring fingers may form a sub-capacitor. Furthermore, the electrodes 206 and 216 connected all sub-capacitors in parallel. In accordance with an embodiment, the total capacitance across the first electrode 206 and the second electrode 216 is the sum of two sub-capacitors.

An insulation material 210 fills the vacancy between two neighboring fingers (e.g., 202 and 212) as well as between two electrodes 206 and 216. In accordance with an embodiment, the insulation material 210 is an extreme low k (ELK) material. The ELK material may comprise fluorine-doped oxide, carbon-doped silicon oxide and the like. The guard ring 104 is employed to enclose the electrodes, the fingers as well as the ELM material. The guard ring 104 helps to prevent moisture from penetrating into the ELM material. As a result, the ramp voltage break down (VBD) or the time dependent dielectric breakdown (TDDB) of the MOM capacitor 102 can be improved.

FIG. 3 illustrates a top view of a second MOM layer of a MOM capacitor in accordance with an embodiment. FIG. 3 is similar to FIG. 2 except that the orientation of electrodes is configured such that the fingers in the second MOM layer are not overlapped with their corresponding fingers in the first MOM layer. Instead, in accordance with an embodiment, the direction of the fingers in the second MOM layer is orthogonal to the direction of the fingers in the first MOM layer (shown in FIG. 2). It should be noted that the electrodes 306 and 316 shown in FIG. 3 are overlapped vertically with their corresponding electrodes (e.g., 206 and 216) shown in FIG. 2. Furthermore, a variety of via plugs (not shown but illustrated in detail in FIG. 4) are employed to connect the electrodes (e.g., electrode 306) of the second MOM layer and the electrodes (e.g., electrode 206) of the first MOM layer.

Figure 4:
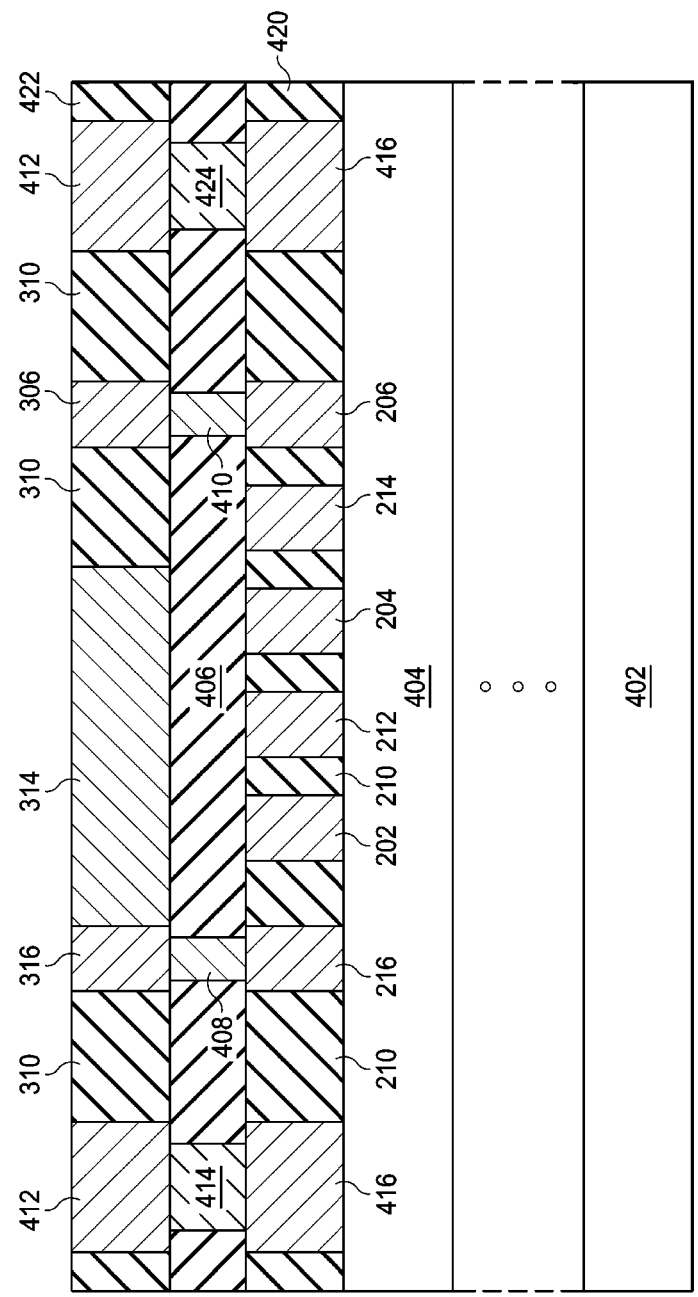
FIG. 4 illustrates a cross-sectional view of the MOM capacitor structure in accordance with an embodiment.

FIG. 4 illustrates a cross-sectional view of the MOM capacitor structure in accordance with an embodiment. The cross-sectional view of the MOM capacitor structure is taken from a plane crossing a line A-A' (shown in FIG. 2 and FIG. 3). As shown in FIG. 4, an inter-layer dielectric layer 404 is formed over a substrate 402. It should be noted that there may be a variety of semiconductor layers between the substrate 402 and the inter-layer dielectric layer 404. The functions of the semiconductor layers are well known, and hence are omitted so as not to hinder the understanding of various embodiments. A first MOM layer 420 comprising an insulating material 210 is formed on the inter-layer dielectric layer 404. The first MOM layer 420 may further comprise fingers 202, 212, 204 and 214. The fingers 202, 212, 204 and 214 may be formed of metallic materials such as copper, aluminum and the like.

As shown in FIG. 4, the insulation material 210 is filled between two neighboring fingers made of metallic materials so as to form a capacitor. For example, the finger 202 and the finger 212 may form a sub-capacitor. Likewise, the finger 204 and the finger 214 may form another sub-capacitor. FIG. 4 further shows a conductive member 416 and another conductive member 426 are formed in the first MOM layer. In accordance with an embodiment, the conductive members 416 and 426 are formed of the same material as the fingers (e.g., finger 202).

A dielectric layer 406 is formed on top of the insulation layer 420 and a second MOM layer 422 is formed on top of the dielectric layer 406. In accordance with an embodiment, the dielectric layer 406 is formed of low k dielectric materials. As shown in FIG. 4, via plugs 408 and 410 are employed to connect the electrodes of the first MOM layer and the electrodes of the second MOM layer. More particularly, the via plug 408 connects the electrode 216 with the electrode 316. Likewise, the via plug 410 connects the electrode 206 with the electrode 306. Furthermore, FIG. 4 shows the finger 314 in the second MOM layer 422 is orthogonal to the fingers (e.g., finger 214) in the first MOM layer 420. The cross-section view also illustrates that the conductive member (e.g., 412) in the second MOM layer 422 is connected with the conductive member (e.g., 416) in the first MOM layer 420 through various via plugs (e.g., via plugs 414 and 424). As a result, the conductive members (e.g., 412 and 416) form a guard ring to enclose the MOM capacitor.

It should be noted that while FIG. 4 shows a guard ring formed on the inter-layer dielectric layer 404, this configuration is merely an example, which should not unduly limit the scope of the claims. One of ordinary skill in the art would recognize many variations, alternatives, and modifications. For example, the guard ring can be combined with the ELK layer (not shown) of the semiconductor device. More particularly, the guard ring can be formed on the M1 layer (not shown) and extended up to the top metal of the MOM capacitor. Alternatively, the guard ring can be formed on the contact plug layer (not shown) and further extended up to the top metal of the MOM capacitor.

Although embodiments of the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include

What is claimed is:

1. A structure comprising:
   a metal-oxide-metal capacitor comprising a low k dielectric insulation layer; and
   a guard ring enclosing the metal-oxide-metal capacitor, wherein the guard ring is configured to prevent moisture from penetrating into the low k dielectric insulation layer.

2. The structure of claim 1, wherein the metal-oxide-metal capacitor comprises:
   a first metal-oxide-metal layer comprising:
      a first electrode coupled to a first finger; and
      a second electrode coupled to a second finger, wherein the first finger and the second finger are in parallel and separated by a first dielectric material.

3. The structure of claim 2, further comprising a second metal-oxide-metal layer comprising:
   a third electrode coupled to a third finger; and
   a fourth electrode coupled to a fourth finger, wherein the third finger and the fourth finger are in parallel and separated by a second dielectric material.

4. The structure of claim 3, wherein the first electrode is coupled to the third electrode through a plurality of via plugs.

5. The structure of claim 3, wherein the second electrode is coupled to the fourth electrode through a plurality of via plugs.

6. The structure of claim 3, wherein:
   a first direction of the first finger is orthogonal to a third direction of the third finger; and
   a second direction of the second finger is orthogonal to a fourth direction of the fourth finger.

7. The structure of claim 1, wherein the guard ring comprises:
   a first conductive member in a first metal-oxide-metal layer; and
   a second conductive member in a second metal-oxide-metal layer, wherein the first conductive member is coupled to the second conductive member through a plurality of via plugs in a dielectric layer between the first metal-oxide-metal layer and the second metal-oxide-metal layer.

8. A multilayer structure comprising:
   a first metal-oxide-metal layer comprising
      a first finger coupled to a first electrode;
      a second finger coupled to a second electrode, wherein the first finger and the second finger are in parallel;
      a first conductive member enclosing the first finger, the second finger, the first electrode and the second electrode;
   a second metal-oxide-metal layer comprising
      a third finger coupled to a third electrode;
      a fourth finger coupled to a fourth electrode, wherein the third finger and the fourth finger are in parallel;
      a second conductive member enclosing the third finger, the fourth finger, the third electrode and the fourth electrode; and
   a dielectric layer comprising:
      a first via plug coupled between the first electrode and the third electrode;
      a second via plug coupled between the second electrode and the fourth electrode; and
      a plurality of via plugs coupled between the first conductive member and the second conductive member.

9. The multilayer structure of claim 8, wherein:
   the first finger and the second finger form a first sub-capacitor; and
   the third finger and fourth finger form a second sub-capacitor.

10. The multilayer structure of claim 9, wherein the first sub-capacitor and the second sub-capacitor form a metal-oxide-metal capacitor.

11. The multilayer structure of claim 10, wherein the first conductive member, the second conductive member and the plurality of via plugs form a guard ring enclosing the metal-oxide-metal capacitor.

12. The multilayer structure of claim 11, wherein the guard ring is formed of metallic materials.

13. The multilayer structure of claim 8, wherein:
   the first finger is separated from the second finger by a first low k dielectric material; and
   the third finger is separated from the fourth finger by a second low k dielectric material.

14. The multilayer structure of claim 8, wherein the first finger, the second finger, the first electrode and the second electrode are formed of a first metallic material.

15. The multilayer structure of claim 8, wherein the third finger, the fourth finger, the third electrode and the fourth electrode are formed of a second metallic material.

16. A capacitor comprising:
   a first electrode coupled to a plurality of first conductive fingers, wherein
      the first conductive fingers are parallel to each other;
   a second electrode coupled to a plurality of second conductive fingers, wherein
      the second conductive fingers are parallel to each other; and
   a first conductive member enclosing the first conductive fingers, the second conductive fingers, the first electrode and the second electrode.

17. The capacitor of claim 16, further comprising:
   a third electrode coupled to a plurality of third conductive fingers, wherein
      the third conductive fingers are parallel to each other; and
      the third conductive fingers are in an adjacent layer;
   a fourth electrode coupled to a plurality of fourth conductive fingers, wherein
      the fourth conductive fingers are parallel to each other; and
      the fourth conductive fingers are in the adjacent layer; and
   a second conductive member enclosing the third conductive fingers, the fourth conductive fingers, the third electrode and the fourth electrode.

18. The capacitor of claim 17, wherein:
   a first direction of the first conductive fingers is orthogonal to a third direction of the third conductive fingers; and
   a second direction of the second conductive fingers is orthogonal to a fourth direction of the fourth conductive fingers.

19. The capacitor of claim 17, wherein:
   the first conductive member is coupled to the second conductive member through a plurality of via plugs; and
   the first conductive member, the second conductive member and the plurality of via plugs form a guard ring.

20. The capacitor of claim 19, wherein the guard ring is made of metallic materials.

* * * * *